US010821476B2

(12) United States Patent
Eovino et al.

(10) Patent No.: US 10,821,476 B2
(45) Date of Patent: Nov. 3, 2020

(54) SONIC TRANSDUCER HAVING A PIEZOELECTRIC DIAPHRAGM ON A FRAME

(71) Applicant: The Regents of the University of California, Oakland, CA (US)

(72) Inventors: Benjamin Eovino, Berkeley, CA (US); Liwei Lin, San Ramon, CA (US); Sina Akhbari, Berkeley, CA (US)

(73) Assignee: The Regents of the University of California, Oakland, CA (US)

(*) Notice: Subject to any disclaimer, the term of this patent is extended or adjusted under 35 U.S.C. 154(b) by 440 days.

(21) Appl. No.: 15/865,139

(22) Filed: Jan. 8, 2018

(65) Prior Publication Data

US 2018/0207682 A1   Jul. 26, 2018

Related U.S. Application Data

(60) Provisional application No. 62/448,818, filed on Jan. 2, 2017.

(51) Int. Cl.
| H01L 41/09 | (2006.01) |
| B06B 1/06 | (2006.01) |
| G01N 29/24 | (2006.01) |
| H01L 41/332 | (2013.01) |

(52) U.S. Cl.
CPC ........ B06B 1/0666 (2013.01); G01N 29/2437 (2013.01); H01L 41/0973 (2013.01); *H01L 41/332* (2013.01)

(58) Field of Classification Search
CPC .............. B06B 1/0666; G01N 29/2437; H01L 41/0973; H01L 41/332
USPC ......................................... 310/311–371, 800
See application file for complete search history.

(56) References Cited

U.S. PATENT DOCUMENTS

| 8,599,490 | B2* | 12/2013 | Lee .......................... G02B 3/14 359/665 |
| 8,922,302 | B2* | 12/2014 | Ruby ....................... H03H 3/04 29/25.35 |
| 9,144,103 | B2* | 9/2015 | Klein ..................... H04W 76/14 |
| 9,667,218 | B2* | 5/2017 | Sridaran ............ H03H 9/02102 |
| 2010/0118413 | A1* | 5/2010 | Kim ........................ G02B 5/005 359/666 |
| 2013/0194057 | A1* | 8/2013 | Ruby ....................... H03H 3/02 333/188 |

* cited by examiner

*Primary Examiner* — Thomas M Dougherty
(74) *Attorney, Agent, or Firm* — Gavrilovich, Dodd & Lindsey LLP

(57) ABSTRACT

A device includes a piezoelectric diaphragm positioned on a frame. A fixed portion of the diaphragm is fixed relative to the frame and an active portion of the diaphragm is not fixed relative to the frame. The active portion of the diaphragm surrounds the fixed portion of the diaphragm and/or has a boundary with a concave shape.

20 Claims, 7 Drawing Sheets

SONIC TRANSDUCER HAVING A PIEZOELECTRIC DIAPHRAGM ON A FRAME

CROSS REFERENCE TO RELATED APPLICATION

This application claims priority under 35 U.S.C. § 119 to U.S. Provisional Application No. 62/448,818, filed Jan. 20, 2017, the disclosure of which is incorporated herein by reference for all purposes.

FIELD

The invention relates to sonic transducers. In particular, the invention relates to sonic transducers having a piezoelectric diaphragm mounted on a frame.

BACKGROUND

In addition to their traditional applications, piezoelectric ultrasound transducers are being used as a platform technology in areas such as fingerprint scanning, imaging, gesture recognition and therapeutics. These transducers typically include a piezoelectric diaphragm attached to a frame. In most applications, it is desirable to design the transducers for a particular frequency, bandwidth, and output pressure (measured in pascals per volt, Pa/V). However, for a given diaphragm structure, the limited number of design parameters make it difficult to separately tune the frequency and sensitivity, which often leads to transducers with an undesirably low sensitivity. As a result, there is a need for a piezoelectric ultrasound transducer structure that can be designed to produce particular output pressures, bandwidths, frequencies, and can provide elevated sensitivities.

SUMMARY

A device includes a piezoelectric diaphragm positioned on a frame. A fixed portion of the diaphragm is fixed relative to the frame and an active portion of the diaphragm is movable relative to the frame.

Another embodiment of the device includes a piezoelectric diaphragm positioned on a frame so as to have a fixed portion and an active portion. The fixed portion is mechanically attached to the frame. The movable portion is spaced apart from the frame such that a fluid or vacuum is positioned between the movable portion and the frame.

In some instances, the piezoelectric diaphragm is included in a Piezoelectric Micromachined Ultrasonic Transducer (MUTs) with a 6 dB velocity bandwidth between 60% and 180%.

In some instances, the active portion of the diaphragm surrounds the fixed portion of the diaphragm and/or has a concave boundary. In some instances, the active portion of the diaphragm has a boundary with one or more points from which a ray can originate and maintain continuous contact with the active portion while being swept over an angle of more than 180°.

The disclosure provides a device, comprising a piezoelectric diaphragm positioned on a frame such that a fixed portion of the diaphragm is fixed relative to the frame and an active portion of the diaphragm is not fixed relative to the frame, the active portion of the diaphragm surrounding the fixed portion of the diaphragm. In one embodiment, the active portion of the diaphragm has an interior boundary that surrounds the fixed portion, the interior boundary having a shape selected from the group consisting of a circle, oval, square, rectangular, triangle, and plus sign. In a further embodiment, the active portion of the diaphragm has an exterior boundary that surrounds the interior boundary, the exterior boundary having a shape selected from the group consisting of a circle, oval, square, rectangular, triangle, and plus sign. In another embodiment, the diaphragm includes a second fixed portion that is fixed relative to the frame. In a further embodiment, the active portion of the diaphragm is between the fixed portion and the second fixed portion. In still another or further embodiment, the second fixed portion of the diaphragm surrounds the active portion of the diaphragm. In another embodiment, the fixed portion of the diaphragm is attached to an interior portion of the frame and the second fixed portion of the diaphragm is attached to an exterior portion of the frame such that the exterior portion of the frame surrounds the interior portion of the frame.

The disclosure also provides a device comprising a piezoelectric diaphragm positioned on a frame so as to have a fixed portion and an active portion, the fixed portion being mechanically attached to the frame and fluid or vacuum being positioned between the active portion and the frame, the active portion of the diaphragm surrounding the fixed portion of the diaphragm. In one embodiment, the device is solid between the frame and the fixed portion of the piezoelectric diaphragm.

The disclosure provides a device comprising a piezoelectric diaphragm positioned on a frame such that a fixed portion of the diaphragm is fixed relative to the frame and an active portion of the diaphragm is not fixed relative to the frame, the active portion of the diaphragm has a boundary with a concave shape. In one embodiment, the active portion of the diaphragm has a boundary with a point from which a ray can originate and maintain continuous contact with the active portion while being swept over an angle of more than 180°.

The disclosure also provides a device comprising a piezoelectric diaphragm positioned on a frame so as to have a fixed portion and an active portion, the fixed portion being mechanically attached to the frame and fluid or vacuum being positioned between the active portion and the frame, the active portion of the diaphragm has a boundary with a concave shape. In one embodiment, the device is solid between the frame and the fixed portion of the piezoelectric diaphragm. In another embodiment, the active portion of the diaphragm has a boundary with a point from which a ray can originate and maintain continuous contact with the active portion while being swept over an angle of more than 180°.

The disclosure also provides a device comprising a piezoelectric diaphragm positioned on a frame such that a fixed portion of the diaphragm is fixed relative to the frame and an active portion of the diaphragm is not fixed relative to the frame, the active portion of the diaphragm having a boundary with a point from which a ray can originate and maintain continuous contact with the active portion while being swept over an angle of more than 180°. In one embodiment, the active portion of the diaphragm has a boundary with a point from which a ray can originate and maintain continuous contact with the active portion while being swept over an angle of more than 180°.

The disclosure provides a device comprising a piezoelectric diaphragm positioned on a frame so as to have a fixed portion and an active portion, the fixed portion being mechanically attached to the frame and fluid or vacuum being positioned between the active portion and the frame, the active portion of the diaphragm having a boundary with a point from which a ray can originate and maintain continuous contact with the active portion while being swept over an angle of more than 180°. In one embodiment, the active portion has the boundary constructed such that the ray can be swept over an angle of more than 270°. In another embodiment, the device is solid between the frame and the fixed portion of the piezoelectric diaphragm. In still another embodiment, the piezoelectric diaphragm is included in a Piezoelectric Micromachined Ultrasonic Transducer (MUT) with a 6 dB velocity bandwidth between 100% and 180%.

DESCRIPTION

As used herein and in the appended claims, the singular forms "a," "an," and "the" include plural referents unless the context clearly dictates otherwise. Thus, for example, reference to a "diaphragm" includes a plurality of diaphragms and reference to the "frame" includes reference to one or more frames or equivalents thereof known to those skilled in the art, and so forth.

Unless defined otherwise, all technical and scientific terms used herein have the same meaning as commonly understood to one of ordinary skill in the art to which this disclosure belongs. Although any methods and reagents similar or equivalent to those described herein can be used in the practice of the disclosed methods and compositions, the exemplary methods and materials are now described.

Also, the use of "and" means "and/or" unless stated otherwise. Similarly, "comprise," "comprises," "comprising" "include," "includes," and "including" are interchangeable and not intended to be limiting.

It is to be further understood that where descriptions of various embodiments use the term "comprising," those skilled in the art would understand that in some specific instances, an embodiment can be alternatively described using language "consisting essentially of" or "consisting of."

The transducer includes a piezoelectric diaphragm positioned on a frame. A fixed portion of the diaphragm is immobilized relative to the frame and an active portion of the diaphragm is movable relative to the frame. The active portion of the diaphragm surrounds the fixed portion of the diaphragm. In some instances, the active portion of the diaphragm has an annular shape that surrounds or substantially surrounds the fixed portion of the diaphragm. This configuration provides additional design parameters that allow a designer to produce a transducer with a broad range of frequency, bandwidth, and pressure output combinations for a given diaphragm composition. Additionally, this transducer configuration has provided surprisingly high bandwidths. Further, the inventors have found that this configuration provides an increased and tunable sensitivity. Additionally or alternately, the directionality can be tuned and, when desired, increased. Accordingly, the transducer provides a combination of enhanced performance with increased design flexibility. As a result, the transducer can be used in an increased number of applications and can provide superior performance in those applications.

Figure 1A:
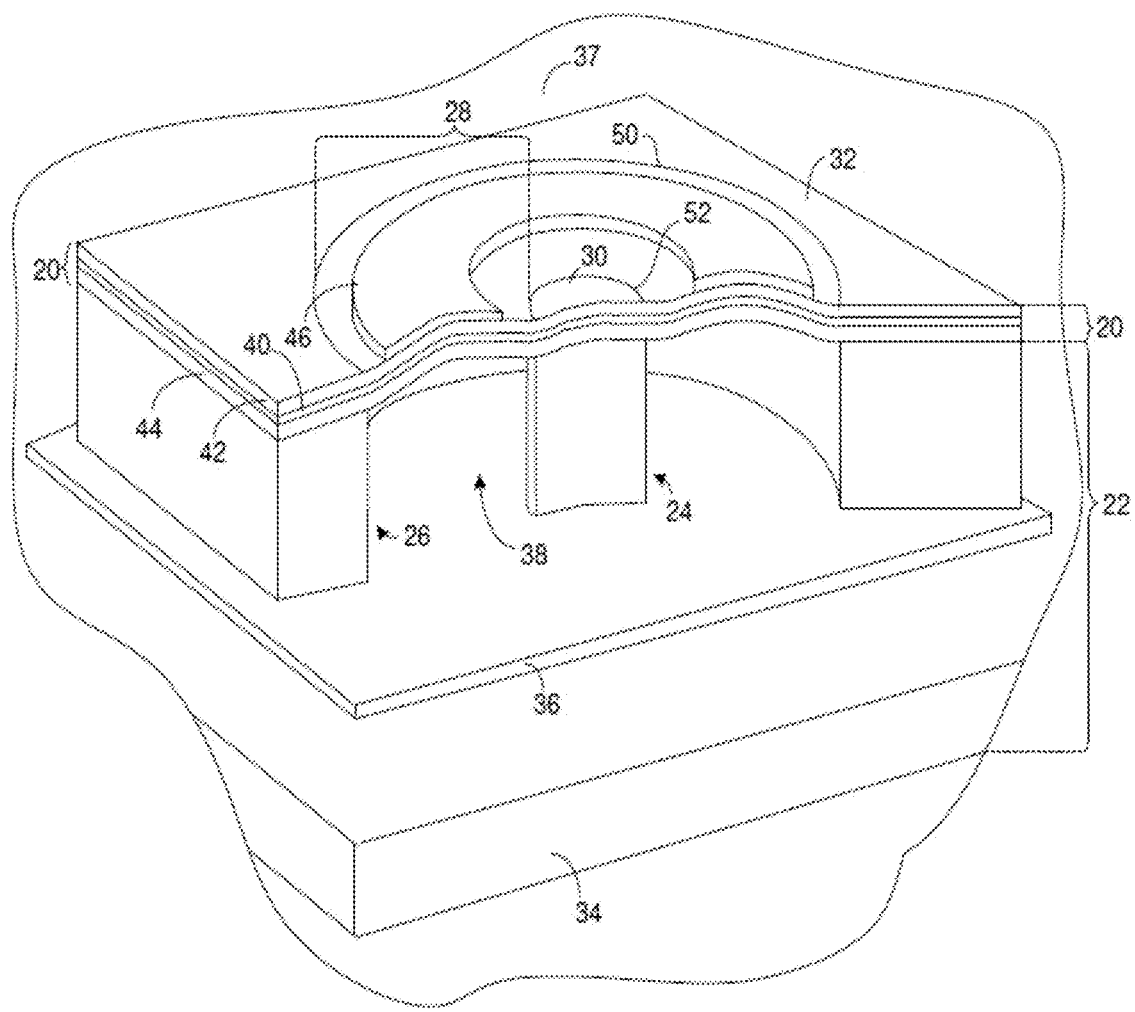
FIG. 1A is a cutaway view of a piezoelectric ultrasound transducer that includes a piezoelectric diaphragm. The transducer is illustrated after application of an electrical field across the diaphragm.
Figure 1B:
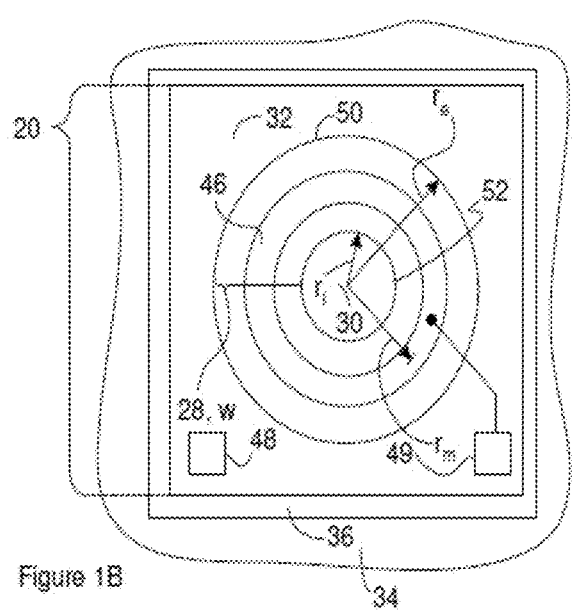
FIG. 1B is a topview of the transducer of FIG. 1A.
Figure 1C:
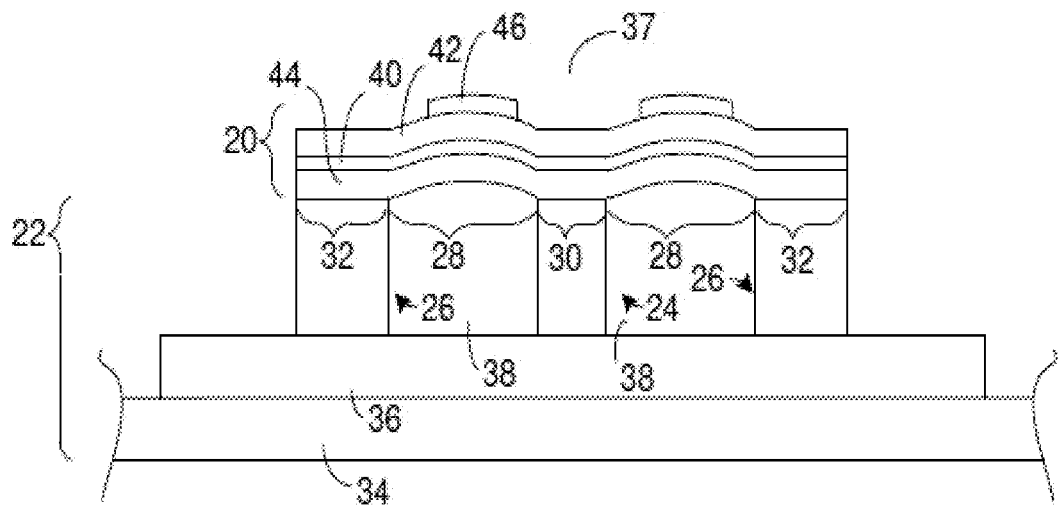
FIG. 1C is a cross section of the transducer of FIG. 1B after the application of the electrical field across the diaphragm.
Figure 1D:
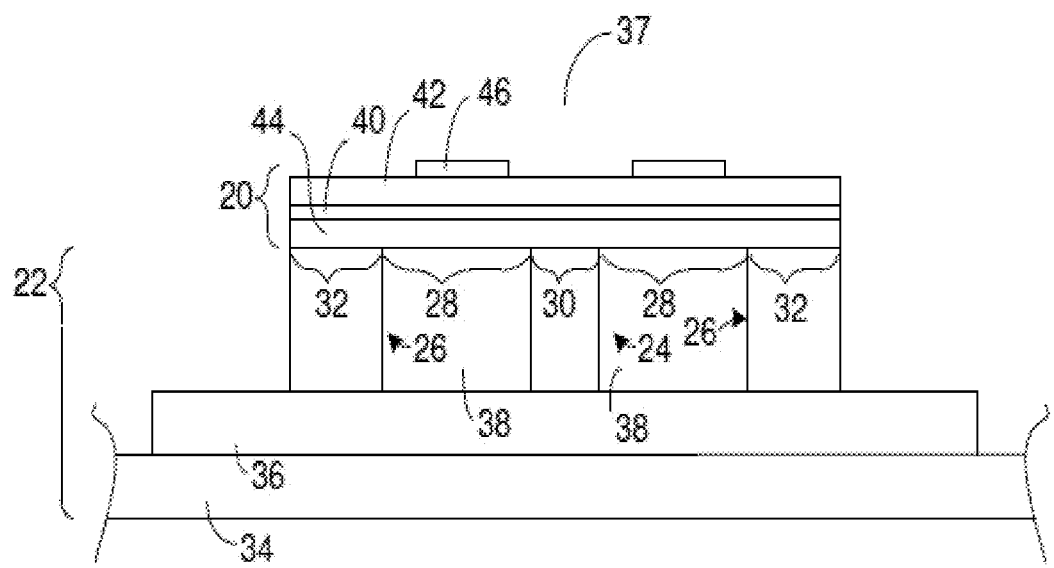
FIG. 1D illustrates the transducer of FIG. 1C before application of an electrical field across the diaphragm.

FIG. 1A through FIG. 1D illustrate a piezoelectric transducer in the class of transducers known as Micromachined Ultrasonic Transducers (MUTs). FIG. 1A is a cutaway view of the transducer. FIG. 1B is a topview of the transducer of FIG. 1A. FIG. 1C is a cross section of the transducer of FIG. 1B. FIG. 1A through FIG. 1C illustrate the transducer after application of an electrical field across the diaphragm. FIG. 1D is a cross section of the transducer of FIG. 1C before application of an electrical field across the diaphragm.

The transducer includes a piezoelectric diaphragm 20 on a frame 22. The frame 22 includes an interior support 24 spaced apart from an exterior support 26. The exterior support 26 can surround the interior support 24. The piezoelectric diaphragm 20 includes an active region 28 between a first fixed region 30 and a second fixed region 32. The first fixed region 30 and the second fixed region 32 are fixed and/or immobilized relative to the frame 22. For instance, the bottom of the first fixed region 30 can be attached to the top interior support 24 and the second fixed region 32 can be attached to the top of the exterior support 26. The attachment can be direct or through the use of an attachment mechanism such as an adhesive or tape. In contrast, the active region 28 is not fixed or immobilized relative to the frame 22. For instance, the active region 28 is not attached to the frame 22 or to the top of the frame 22. As an example, the active region 28 is spaced apart from the frame 22 such that a fluid or vacuum is positioned between the active region 28 and the frame 22. The interior support 24 and the exterior support 26 can be constructed of the same materials or from different materials. Suitable materials for the interior support 24 and the exterior support 26 include, but are not limited to, silicon, silicon oxide, silicon nitride, and nickel.

The frame 22 can include a substrate 34. An optional sealing medium 36 can attach the interior support 24 and/or the exterior support 26 to the substrate 34. In some instances, the substrate 34 includes the sealing medium 36. Suitable substrates 34 include, but are not limited to, printed circuit boards, wafers with CMOS or other electronics, and silicon wafers. Suitable sealing media include, but are not limited to, tape, adhesive, photoresist, and metals.

An upper surface of the piezoelectric diaphragm can be in contact with an acoustic medium 37. In some instances, the acoustic medium 37 is the atmosphere in which the transducer is positioned. Accordingly, the acoustic medium 37 can be a fluid such as air.

The interior support 24, exterior support 26, the piezoelectric diaphragm 20, and the sealing medium 36 and/or substrate 34 can form the boundary of a chamber 38. In some instances, the chamber 38 is sealed such that a fluid or vacuum in the chamber 38 needs not interact with the acoustic medium 37 and/or atmosphere in which the transducer is positioned. In some instances, the fluid in the chamber is a gas and/or liquid. The active region 28 of the illustrated piezoelectric diaphragm 20 is positioned over the chamber 38 and is accordingly free to move into the chamber 38 and/or away from the chamber 38 during operation of the transducer.

The illustrated piezoelectric diaphragm 20 includes a conductive layer 40 between an active layer 42 and a passive layer 44. The active layer 42 includes, consists of, or consists essentially of a piezoelectric material. The passive layer 44 is optional and in some instances is constructed of the same material as the active layer 42. Alternately, the passive layer 44 and the active layer 42 can be constructed of different materials. Accordingly, the passive layer 44 can exclude piezoelectric materials. Suitable materials for the conductive layer 40 include, but are not limited to, molybdenum, aluminum, gold, and platinum. Suitable materials for the active layer 42 include, but are not limited to, piezoelectric materials such as aluminum nitride, lead zirconate titonate, zinc oxide, and polyvinylidene fluoride. The passive layer 44 is also commonly referred to as an elastic layer, structural layer, or inactive layer. Suitable materials for the passive layer 44 include materials that are used in the active layer 42 of piezoelectric diaphragms 20. Examples of materials for use as the passive layer 44 include, but are not limited to, silicon oxide, silicon nitride, silicon, and polysilicon, in addition to the material for the active layer 42.

An electrode 46 is positioned on the piezoelectric diaphragm 20 such that application of a voltage between the conductive layer 40 and the electrode 46 during operation of the transducer generates an electrical field across the active layer 42. For instance, at least a portion of the electrode 46 can be positioned on the active region 28 of the piezoelectric diaphragm 20. In the illustrated embodiment, the entire electrode 46 is positioned in the piezoelectric diaphragm 20. For instance, the electrode 46 is an annulus located entirely between the inner radius of the piezoelectric diaphragm 20 and the outer radius of the piezoelectric diaphragm 20. As a result, the electrical field applied during the operation of the transducer remains is substantially uniform around the active region 28 of the piezoelectric diaphragm 20.

In some instances, the substrate 34 is a printed circuit board, CMOS wafer, or other wafer with electronics on it. Interconnection technologies such as wire bonding can be used to provide electrical communication between electronics on the printed circuit board and the transducer. For instance, wire bonding can be used to provide electrical communication between a contact pad on the printed circuit board and a contact pad 48 in electrical communication with the conductive layer 40. Wire bonding can also be used to provide electrical communication between a contact pad on the printed circuit board and a contact pad 49 in electrical communication with the electrode 46.

The substrate 34 can include electronics for forming an electrical field in the active layer 42 of the piezoelectric diaphragm 20. For instance, the electronics can apply a voltage between the conductive layer 40 and the electrode 46 through the contact pad 48 and the contact pad 49. The applied voltage forms an electrical field across the active layer 42. Since the active layer 42 includes a piezoelectric material, the active layer 42 expands or contracts in response to the electrical field. Expansion or contraction of the active layer 42 in the lateral direction causes bending and/or deformation of the piezoelectric diaphragm 20 into the chamber 38 or away from the chamber 38 unless there is compensating movement in the other layers of the piezoelectric diaphragm. When one polarity of voltage causes movement of the piezoelectric diaphragm 20 into the chamber 38, a reversal of the polarity generally causes movement of the piezoelectric diaphragm 20 away from the chamber 38. FIG. 1A and FIG. 1C illustrate the piezoelectric diaphragm 20 when a voltage is applied so as to move the piezoelectric diaphragm 20 away from the chamber 38. FIG. 1D illustrates the piezoelectric diaphragm 20 when a voltage is not applied to the transducer. As is evident from FIG. 1D, the piezoelectric diaphragm 20 can be constructed so as to have a planar state when in an undeformed state and/or to pass through a planar state during operation of the transducer. However, it is possible to construct the piezoelectric diaphragm 20 such that the piezoelectric diaphragm 20 does not occupy a planar state when in an undeformed state and/or to pass through a planar state during operation of the transducer. In some instances, the boundary of the active portion of the piezoelectric diaphragm 20 is in a single plane when the piezoelectric diaphragm 20 is constructed so as to satisfy one or more conditions selected from the group consisting of the piezoelectric diaphragm 20 occupies a planar state when in an undeformed state, does not occupying a planar state when in an undeformed state, passes through a planar state during operation of the transducer, and/or does not passing through a planar state during operation of the transducer.

The electronics can apply an electrical signal to the transducer such that the resulting movement of the piezoelectric diaphragm 20 generates an ultrasonic sound wave. Alternately, the transducer can be operated in reverse. For instance, pressure applied to the piezoelectric diaphragm 20 generates an electrical signal that can be measured from the electrode 46.

As is evident, from FIG. 1A and FIG. 1B, the active region 28 of the illustrated piezoelectric diaphragm 20 has an exterior boundary 50 and an interior boundary 52. The longest dimension that extends between two different points on the exterior boundary 50 and also through the center of the active region 28 is called the major dimension below. For instance, when the active region 28 has an annular shape as shown in FIG. 1A through FIG. 1D, an exterior radius of the annular shape (labeled $r_e$ in FIG. 1B) is equal to half the major dimension. The shortest dimension that extends between two different points on the interior boundary 52 and also through the center of the active region 28 is called the minor dimension below. For instance, when the active region 28 has an annular shape as shown in FIG. 1A through FIG. 1D, an interior radius of the annular shape (labeled $r_i$ in FIG. 1B) is equal to half the minor dimension. The width of the active region 28 shown in FIG. 1A through FIG. 1D is labeled "w" in FIG. 1B and is equal to the difference between the interior radius labeled and the exterior radius ($r_e - r_i$). The midpoint radius of the active region 28 shown in FIG. 1A through FIG. 1D is labeled $r_m$ in FIG. 1B and is the radius of the active region 28 half way across the width of the active region 28. Accordingly, the midpoint radius of the active region 28 can be determined from: $(r_e + r_i)/2$.

The active region width (w) and the midpoint radius ($r_m$) are variables that can be used in the design of the transducer.

For instance, the inventors have found that the frequency for the transducer is dependent on piezoelectric diaphragm properties and active region width (w), but is independent or substantially independent of midpoint radius ($r_m$). Conversely, the output pressure, bandwidth, directionality, and other performance metrics are strong functions of midpoint radius ($r_m$). This results in a readily configurable design. For example, with a given piezoelectric diaphragm 20 composition, the fundamental mode resonance frequency can be set with the active region width (w) and the desired output pressure, bandwidth, and/or directionality can be produced by varying the midpoint radius ($r_m$). Adjustments to active region width (w), the midpoint radius ($r_m$), material selection and/or thickness of the piezoelectric diaphragm 20 can also be used to tune sensitivity. Material selection and/or thickness of the piezoelectric diaphragm 20 can be adjusted to tune sensitivity once active region width (w) and the midpoint radius ($r_m$) are selected. Additionally or alternately, adjustments to midpoint radius ($r_m$) and/or the acoustic medium 37 can be used to tune directionality. The acoustic medium 37 can be changed to tune the directionality once active region width (w) and the midpoint radius ($r_m$) are selected.

Although the piezoelectric diaphragm is illustrated with a conductive layer 40 between an active layer 42 and a passive layer 44, other constructions of the piezoelectric diaphragm are possible. For instances, the layers can be re-arranged. As an example, the active layer 42 can be between the passive layer 44 and the frame. Alternately, the piezoelectric diaphragm can include one or more features selected from the group consisting of more than one active layer 42, more than one passive layer 44, more than one conductive layer 40, and more than one electrode 46.

Figure 2:
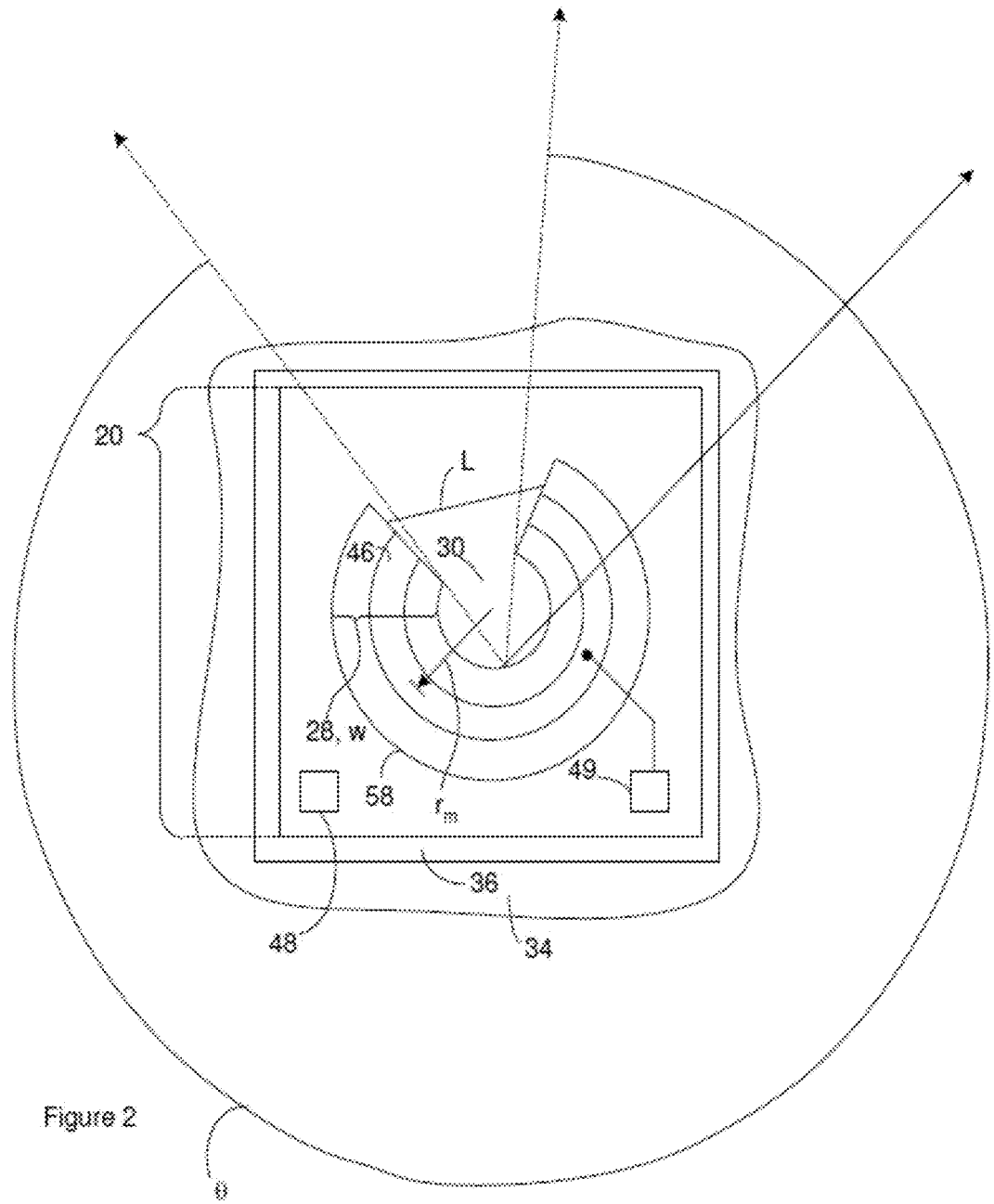
FIG. 2 is a topview of a piezoelectric ultrasound transducer where a active region does not entirely surround a fixed region.

The active regions 28 disclosed above have a concave boundary in that a line segment can be drawn from one point on the boundary to another point on the boundary with the line segment being outside of the active region 28. The above performance results can be achieved using piezoelectric diaphragms with other concave shapes. For instance, the above performance results can be achieved with piezoelectric diaphragms having an active region 28 that does not entirely surround the first fixed region 30. For instance, the active region 28 can have a semi-circular configuration. FIG. 2 is a topview of a piezoelectric ultrasound transducer where the active region 28 does not entirely surround the first fixed region 30 and has a semi-circular configuration. The boundary of the active region 28 has a concave shape. For instance, the line labeled L illustrates that a line segment can be drawn from one point on the boundary to another point on the boundary with the line segment being outside of the active region 28.

In addition or as an alternative to the concave shape of the boundary, the active region 28 can have a boundary 58 constructed so as to have one or more points from which originates a ray that maintains continuous contact with the active region 28 while being swept over an angle θ in the plane of the undeformed piezoelectric diaphragm 20. For instance, FIG. 2 illustrates a point on the boundary from which a ray 58 originates. The ray maintains constant contact with the active region 28 while being swept over the angle θ. The angle θ can be greater than 180°, 270°, or 320° and/or less than or 360°. As the angle θ decreases, many of the characteristics described above begin to decrease. For instance, the enhanced directionality, enhanced bandwidth, and the independence of the resonant frequency and the midpoint radius ($r_m$) can decrease at lower values of the angle θ. However, as with the transducer of FIG. 1A through FIG. 1D, the active region width (w) and the midpoint radius ($r_m$) are variables that can be used in the design of the transducer. As noted above, these variables can be tuned along with material selection, thickness of the piezoelectric diaphragm, and acoustic medium to tune the resonant frequency, output pressure, bandwidth, and directionality of the transducer.

Although the fixed region 30 is described as being immobilized and/or fixed relative to the frame, the fixed region 30 may experience vibration and/or movement during operation of the transducer. For instance, the method of attaching the fixed region 30 to the frame may not be rigid. As an example, thermal tape can be used to attach the fixed region 30 to the frame and can be sufficiently flexible to permit movement of the fixed region 30 relative to the frame during operation of the transducer. As a result, the first fixed region 30 and the second fixed region 32 may both vibrate during operation of the transducer.

The above transducers have improved bandwidths relative to prior transducers. Bandwidth is the range of frequencies for which a transducer has a substantial response. In Piezoelectric Micromachined Ultrasonic Transducers (MUTs), the most commonly used bandwidth is the 6 dB velocity bandwidth. The 6 dB velocity bandwidth is defined in terms of the velocity frequency response (e.g. velocity on the y-axis, frequency on the x-axis) and can be measured by $(\Delta f)/f_0 = (f_{max} - f_{min})/f_0$ where $f_0$ is the resonance frequency (or equivalently, the frequency at which the velocity is maximized), $f_{max}$ is the maximum frequency that marks off −6 dB (or equivalently, 50% of the maximum amplitude) and $f_{min}$ is the minimum frequency that marks off the −6 dB point (or equivalently, 50% of the maximum amplitude). Prior standalone piezoelectric MUTs generally produced bandwidths of at most 97%, however, the current transducers can surprisingly provide bandwidths that range from less than 15%, to over 150%.

FIG. 3A through FIG. 3E illustrate a method of fabricating an ultrasound transducer according to FIG. 1A through FIG. 1E. The transducer is built on a frame precursor 60. Suitable frame precursors 60 include, but are not limited to, substrates of the frame material. For instance, a silicon substrate can serve as the frame precursor 60. The layers of the piezoelectric diaphragm 20 are formed on the frame precursor 60 so as to provide a device precursor having the cross section shown in FIG. 3A. For instance, the passive layer 44, conductive layer 40, an active layer 42 and an electrode layer 62 can be formed on the frame precursor 60. As will become evident below, a portion of the electrode layer 62 becomes the electrode 46. Although not shown, the electrode layer 62 can also become the contact pad 49 of FIG. 1B and/or can provide electrical communication between the electrode 46 and the contact pad 49 of FIG. 1B. As a result, the electrode layer 62 can be constructed of the material that is desired for the electrode 46 and/or contact pad 49. Suitable methods for forming the layers on the frame precursor 60 include, but are not limited to, sputter, deposition, chemical vapor deposition, physical vapor deposition, sol-gel processing, and adhesion of previously formed films.

Figure 3A:
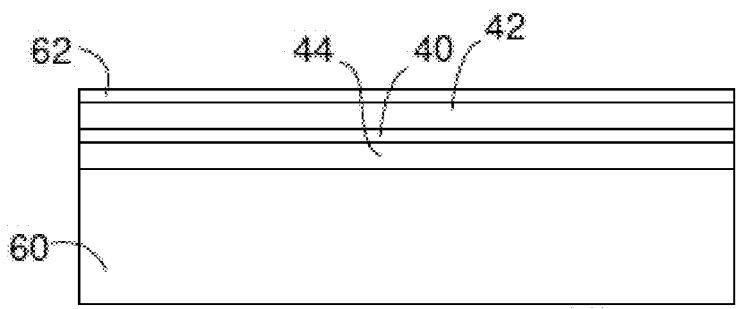
FIG. 3A through FIG. 3E illustrate a method of making a piezoelectric ultrasound transducer according to FIG. 1A through FIG. 1D.
Figure 3B:
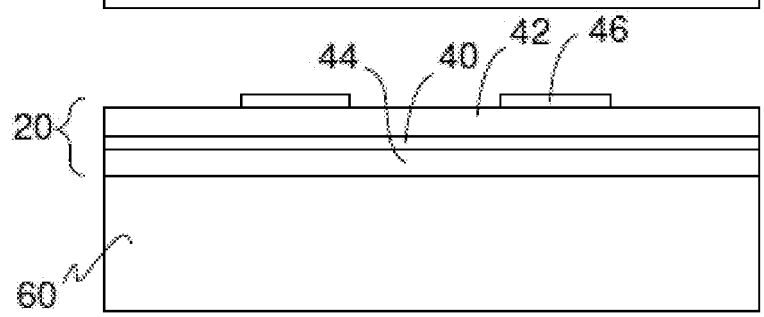

The electrode layer 62 on the device precursor of FIG. 3A is patterned so as to form the electrodes 46 on the device precursor as shown in FIG. 3B. Suitable methods for patterning the electrode layer 62 include, but are not limited to, photolithography, etching, and lift-off.

A contact pad mask 64 can be formed on the device precursor of FIG. 3B. The contact pad mask 64 can be patterned and a pad etch can be performed on the resulting device precursor so as to provide the device precursor of FIG. 3C. The contact pad mask 64 is patterned such that a location where contact pad 48 is desired is exposed while the contact pad mask 64 protects the remainder of the device precursor. The etch is performed for a duration that is sufficient to etch through the active layer 42 and expose the underlying conductive layer 40. The exposed conductive layer 40 can be used as an electrical contact or an electrical pad during operation of the transducer. Suitable contact pad masks 64 include, but are not limited to, hard masks such as silica films, silicon nitride films, and photoresist. Suitable methods of patterning the contact pad mask 64 include, but are not limited to, photolithography, other forms of lithography, and etching. A suitable pad etch includes, but is not limited to, an anisotropic etch such as a reactive ion etch, chemical wet etches, and ion milling.

Figure 3C:
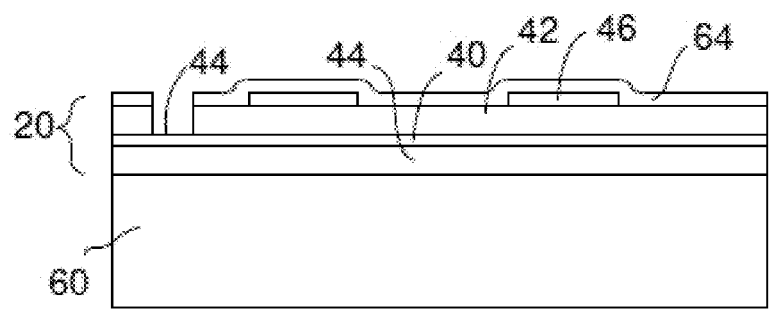

The contact pad mask 64 can be removed and a chamber mask 70 formed on the bottom of the frame precursor 60 of FIG. 3C. The chamber mask 70 can be patterned and a chamber etch can be performed on the resulting device precursor so as to provide the device precursor of FIG. 3D. The chamber mask 70 is patterned such that the desired location of the chamber 38 within the frame precursor 60 is exposed while the chamber mask 70 protects the remainder of the bottom of the frame precursor 60. The chamber etch is performed for a duration that is sufficient to etch through the frame precursor 60 to the passive layer 44. As is evident from FIG. 3D, the chamber etch forms a recess in the frame precursor 60. The recess defines a portion of the interior support 24 and the exterior support 26 for the frame 22 of FIG. 1A through FIG. 1E. Suitable chamber masks 70 include, but are not limited to, silicon oxide, silicon nitride, photoresist, and other polymers. Suitable methods of patterning the chamber mask 70 include, but are not limited to, photolithography, other forms of lithography, and etching. A suitable chamber etch includes, but is not limited to, deep reactive ion etching, reactive ion etching, and anisotropic wet etching.

Figure 3D:
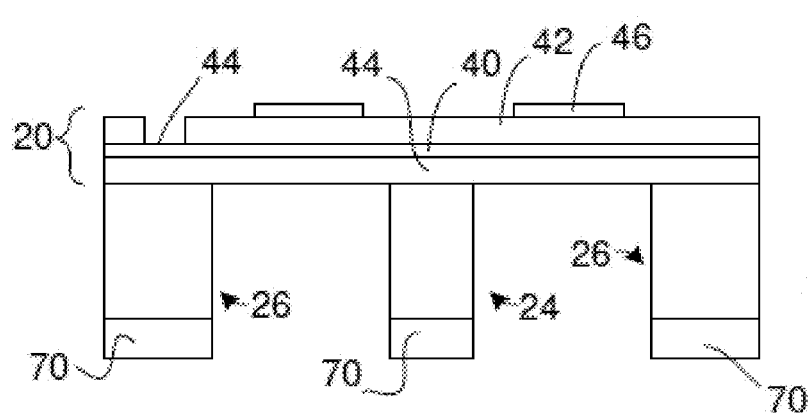
Figure 3E:
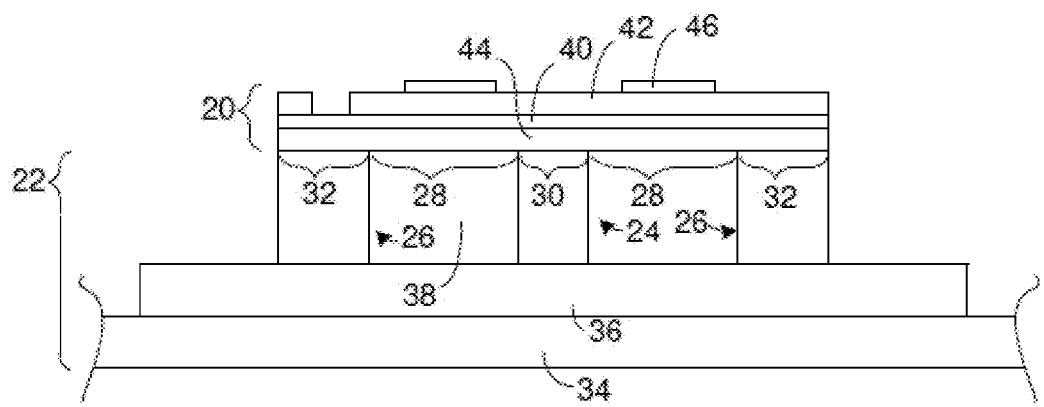

The device precursor of FIG. 3D can be sealed to the substrate 34 so as to provide the transducer of FIG. 3E. Suitable methods of sealing the substrate 34 to the device include, but are not limited to, thermal release tape, silicon adhesive, eutectic bonding, and thermocompression bonding.

Although FIG. 3A through FIG. 3E illustrate a method of fabricating an ultrasound transducer according to FIG. 1A through FIG. 1E, the method is easily modified to fabricate the ultrasound transducer of FIG. 2. For instance, the masks can be patterned so as to the ultrasound transducer of FIG. 2.

EXAMPLES

Example 1

The method of FIG. 3A through FIG. 3F was used to generate several transducers according to FIG. 1A through FIG. 1D with the electrode covering 55% of the active region. The electrode and conductive layer were molybdenum, the active layer and the passive layer were 800 nm and 1000 nm thick aluminum nitride, respectively, and the frame was silicon. The electrodes and conductive layers each had a thickness of 130 nm. The transducers had an active region width of 115 μm and midpoint radii of 100 μm, 175 μm, 250 μm, 325 μm, and 400 μm.

Figure 4A:
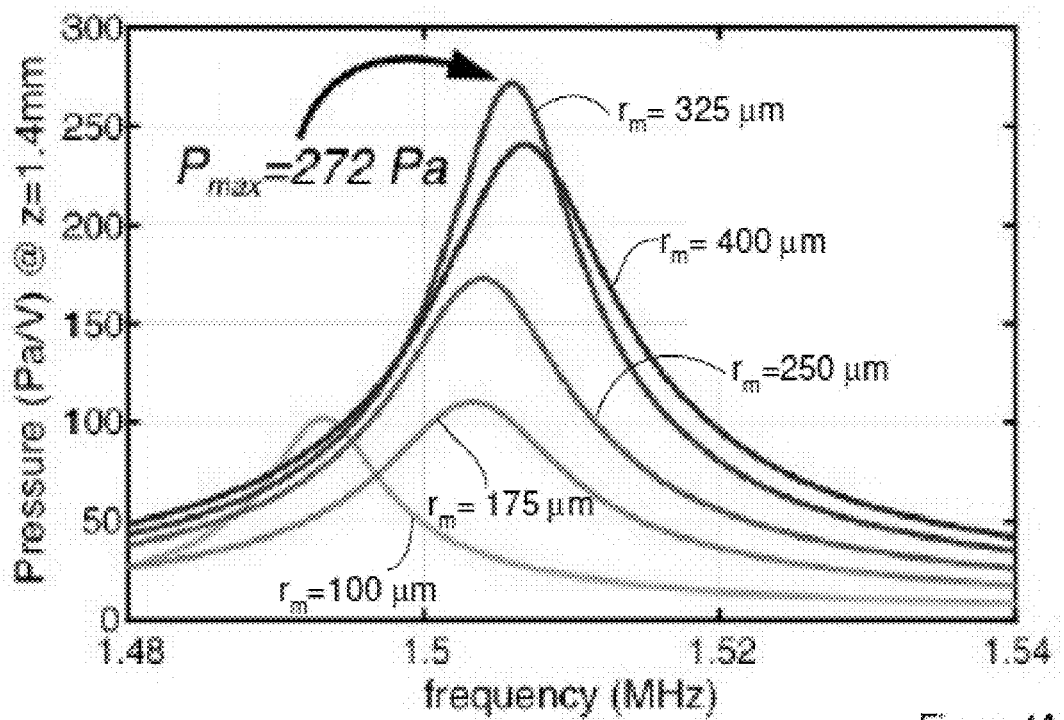
FIG. 4A is a plot comparing the pressure versus frequency curves for annular transducers having different dimensions.

The transducers were each studied for far field pressure versus frequency and the simulation results are presented in FIG. 4A. The far field pressures are determined at 1.4 mm from the transducer surface. A change in the midpoint radii changing of 300 μm produced a change in the fundamental mode resonant frequency of less than 0.03 MHz. As a result, the fundamental mode resonance frequency is independent of the midpoint radius or is not substantially dependent on the midpoint radius. In contrast, the change in the midpoint radii of 300 μm produced a far field pressure change of more than 150 Pa/V. As a result, the far field pressure is strongly dependent on the midpoint radius.

Example 2

The method of FIG. 3A through FIG. 3F was used to generate a circular transducer with a circular piezoelectric diaphragm but without an interior support. The electrode covered 70% of the active region of the piezoelectric diaphragm. The electrode and conductive layer were molybdenum, the active layer and the passive layer were 800 nm and 1000 nm thick aluminum nitride, respectively, and the frame was silicon. The circle had a radius of 77.25 μm.

Figure 4B:
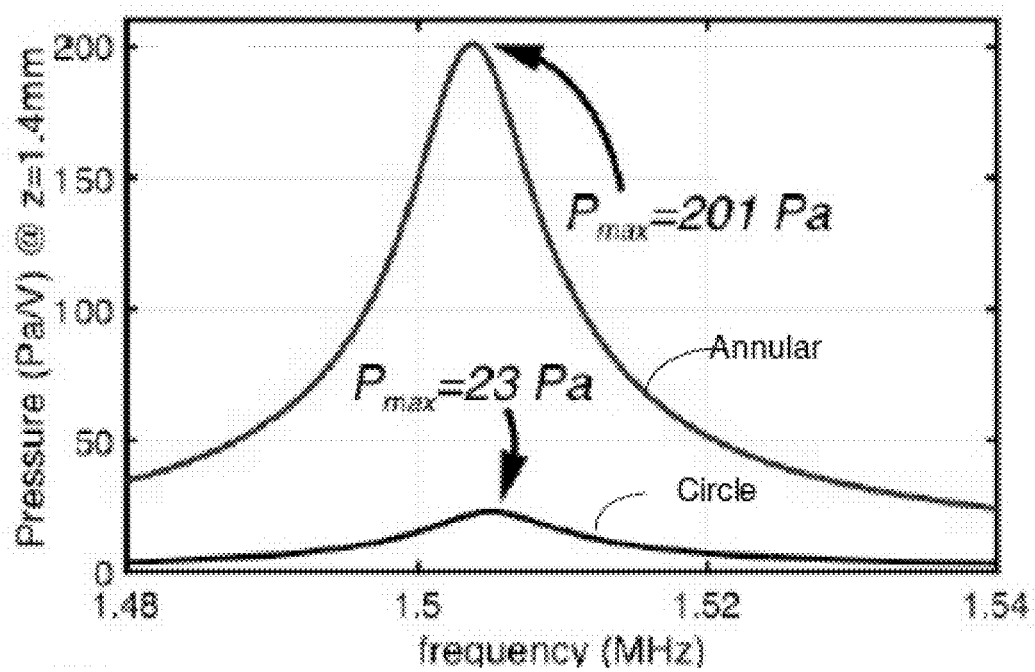
FIG. 4B is a plot comparing the pressure versus frequency curves for an annular transducer and a circular transducer.

The method of FIG. 3A through FIG. 3F was used to generate an annular transducers according to FIG. 1A through FIG. 1D with the electrode covering 55% of the active region. The electrode and conductive layer were molybdenum, the active layer and the passive layer were 800 nm and 1000 nm thick aluminum nitride, respectively, and the frame was silicon. The transducers had an active region width of 115 μm and midpoint radius of 225 μm. The circular transducer and the annular transducer were studied for far field pressure versus frequency. The results are presented in FIG. 4B. The fundamental mode resonant frequency is about 1.5 MHz for both transducers; however, the peak far field pressure for the annular transducer was 201 Pa/V while the peak far field pressure for the circular transducer was 23 Pa/V. Accordingly, the peak far field pressure for the annular transducer was about 7.7 times higher than the peak far field pressure for the annular transducer was 201 Pa/V while the peak far field pressure for the circular transducer. Accordingly, the transducer construction disclosed about has an increased sensitivity when compared with a circular piezoelectric diaphragm.

Example 3

Figure 4C:
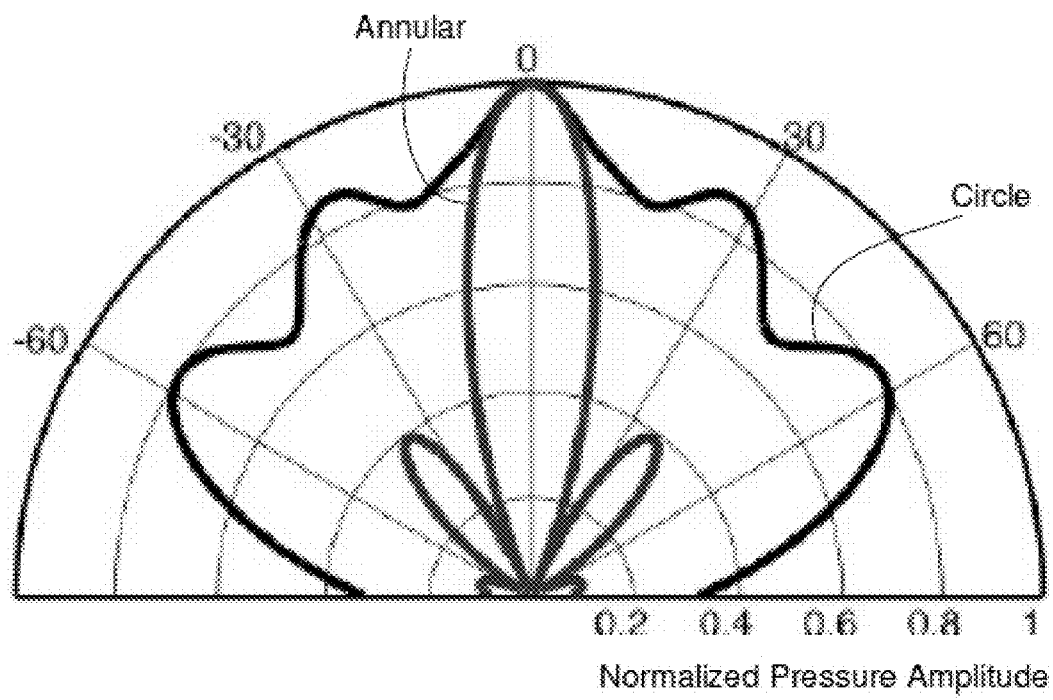
FIG. 4C is a plot comparing the acoustic output pressure versus angle curves for an annular transducer and a circular transducer.

The normalized far field pressure for the transducers of Example 2 were studied as a function of direction. FIG. 4C illustrates the results as a plot of normalized pressure versus angle. The angle is measured relative to a direction that is perpendicular to the upper surface of the piezoelectric diaphragm. As a result, an angle of 0° corresponds to a direction that is perpendicular to the upper surface of the piezoelectric diaphragm and an angle of 90° corresponds to a direction that is in the plane of the upper surface of the undeformed piezoelectric diaphragm. The results show that the transducers disclosed above provide improved and tunable directionality compared to circular transducers.

Example 4

The method of FIG. 3A through FIG. 3F was used to generate several transducers according to FIG. 1A through FIG. 1D with the electrode covering 55% of the active region. The electrode and conductive layer were molybdenum, the active layer and the passive layer were 800 nm and 1000 nm thick aluminum nitride, respectively, and the frame was silicon. The transducers had an active region width of 115 μm and various midpoint radii, $r_m$. The transducers were operated with Fluorinert FC-84 as the acoustic medium and tested for 6 dB velocity bandwidth. The transducer with a midpoint radius, $r_m$, of 300 μm provided a 6 dB velocity bandwidth of 160%. The transducer with a midpoint radius, $r_m$, of 250 μm provided a 6 dB velocity bandwidth of 83%. The transducer with a midpoint radius, $r_m$, of 200 μm provided a 6 dB velocity bandwidth of 68%.

Figure 5A:
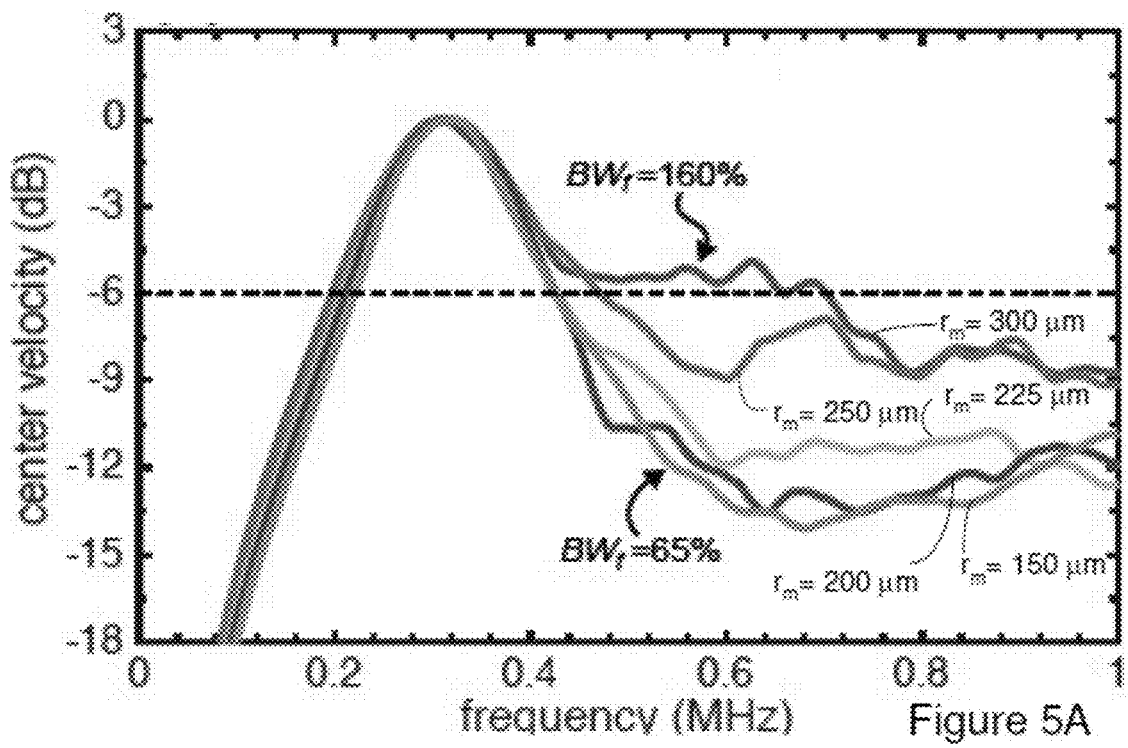
FIG. 5A is a plot of experimentally determined diaphragm velocity versus frequency for transducers with different midpoint radii.
Figure 5B:
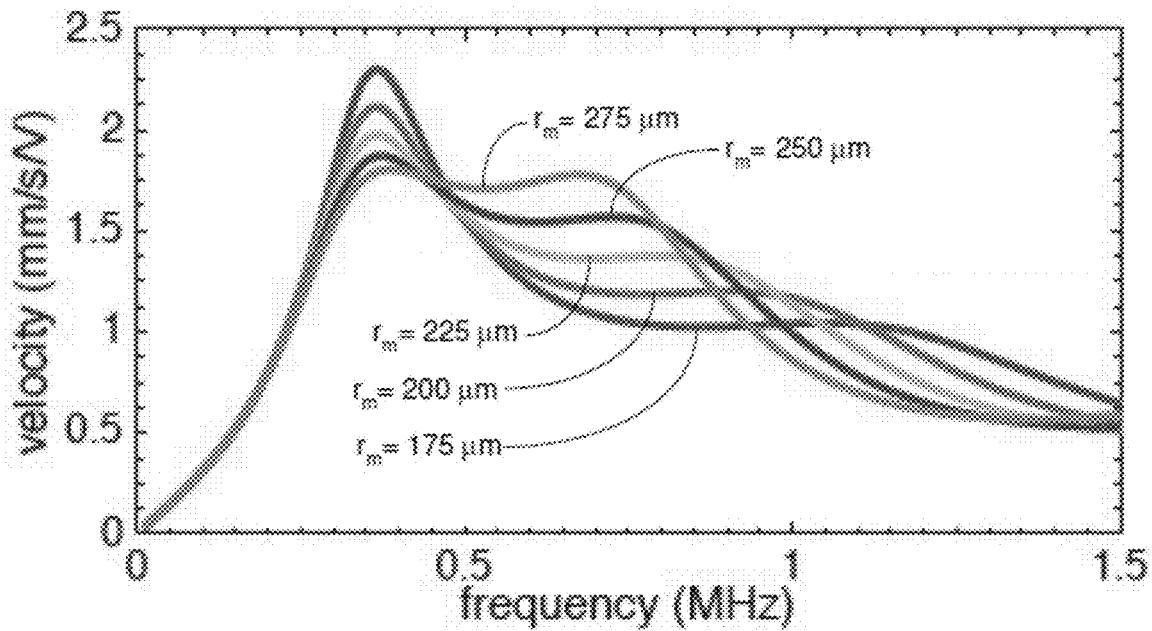
FIG. 5B is a plot of simulated results for diaphragm velocity versus frequency for transducers with different midpoint radii.

The results for center velocity (the velocity at the midpoint radius, $r_m$) versus frequency are illustrated in FIG. 5A. The results at a frequency of around 0.65 MHz show a second resonance peak beginning to emerge. The emergence of the second resonance peak is consistent with simulation results for center velocity versus frequency as shown in FIG. 5B. The second resonance peak is believed to be more evident in FIG. 5B as a result of the large active region widths used to generate this data, resulting in a reduction in fundamental resonance frequency. It is believe that reducing active region widths would more clearly show the second resonance peak in the experimentally determined results.

The second peak shown in FIG. 5A and FIG. 5B is not the result of a second vibration mode but occurs by an alternative mechanism. In particular, the second resonance peak results from reduced loading of the piezoelectric diaphragm by acoustic medium, at specific frequencies, allowing the piezoelectric diaphragm to move at higher speeds. As is evident in FIG. 5A and FIG. 5B, the presence of the second resonance peak is the source of the surprising bandwidth increase shown by the above transducers.

Although FIG. 1A through FIG. 1D illustrate an active region with an annular shape, the active region 28 can have other shapes. Further, the shape of the interior boundary 52 and the exterior boundary can be the same or different. For instance, the interior boundary 52 can have a shape selected from the group consisting of polygons and curved geometries such as a circle, oval, square, rectangular, triangle, and plus signs and the exterior boundary can have a shape selected from the group consisting of polygons and curved geometries such as a circle, oval, square, rectangular, triangle, and plus sign.

A suitable length for the major dimension of the active region 28 of the piezoelectric diaphragm 20 includes, but is not limited to, lengths greater than 10 nm, or 1 micron and/or less than 2 mm, or 10 mm. Additionally, a suitable length for the major dimension of the active region 28 of the piezoelectric diaphragm 20 includes, but is not limited to, lengths greater than 10 nm, or 1 micron and/or less than 2 mm, or 10 mm.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:

1. A device, comprising:
a piezoelectric diaphragm positioned on a frame such that a fixed portion of the diaphragm is fixed relative to the frame and an active portion of the diaphragm is not fixed relative to the frame,
the active portion of the diaphragm surrounding the fixed portion of the diaphragm.

2. The device of claim 1, wherein the active portion of the diaphragm has an interior boundary that surrounds the fixed portion, the interior boundary having a shape selected from the group consisting of a circle, oval, square, rectangular, triangle, and plus sign.

3. The device of claim 2, wherein the active portion of the diaphragm has an exterior boundary that surrounds the interior boundary, the exterior boundary having a shape selected from the group consisting of a circle, oval, square, rectangular, triangle, and plus sign.

4. The device of claim 1, wherein the diaphragm includes a second fixed portion that is fixed relative to the frame.

5. The device of claim 4, wherein the active portion of the diaphragm is between the fixed portion and the second fixed portion.

6. The device of claim 4, wherein the second fixed portion of the diaphragm surrounds the active portion of the diaphragm.

7. The device of claim 1, wherein the fixed portion of the diaphragm is attached to an interior portion of the frame and the second fixed portion of the diaphragm is attached to an exterior portion of the frame such that the exterior portion of the frame surrounds the interior portion of the frame.

8. The device of claim 1, wherein the active portion of the diaphragm has a boundary with a concave shape.

9. The device of claim 8, wherein the active portion of the diaphragm has a boundary with a point from which a ray can originate and maintain continuous contact with the active portion while being swept over an angle of more than 180°.

10. A device, comprising:
a piezoelectric diaphragm positioned on a frame so as to have a fixed portion and an active portion, the fixed portion being mechanically attached to the frame and fluid or vacuum being positioned between the active portion and the frame,
the active portion of the diaphragm surrounding the fixed portion of the diaphragm.

11. The device of claim 10, wherein the device is solid between the frame and the fixed portion of the piezoelectric diaphragm.

12. The device of claim 10, wherein the active portion of the diaphragm has a boundary with a concave shape.

13. The device of claim 12, wherein the device is solid between the frame and the fixed portion of the piezoelectric diaphragm.

14. The device of claim 12, wherein the active portion of the diaphragm has a boundary with a point from which a ray can originate and maintain continuous contact with the active portion while being swept over an angle of more than 180°.

15. A device, comprising:
a piezoelectric diaphragm positioned on a frame such that a fixed portion of the diaphragm is fixed relative to the frame and an active portion of the diaphragm is not fixed relative to the frame,
the active portion of the diaphragm having a boundary with a point from which a ray can originate and maintain continuous contact with the active portion while being swept over an angle of more than 180°.

16. The device of claim 15, wherein the active portion of the diaphragm has a boundary with a point from which a ray can originate and maintain continuous contact with the active portion while being swept over an angle of more than 180°.

17. A device, comprising:
a piezoelectric diaphragm positioned on a frame so as to have a fixed portion and an active portion, the fixed portion being mechanically attached to the frame and fluid or vacuum being positioned between the active portion and the frame,
the active portion of the diaphragm having a boundary with a point from which a ray can originate and maintain continuous contact with the active portion while being swept over an angle of more than 180°.

18. The device of claim 17, wherein the active portion has the boundary constructed such that the ray can be swept over an angle of more than 270°.

19. The device of claim 17, wherein the device is solid between the frame and the fixed portion of the piezoelectric diaphragm.

20. The device of claim 17, wherein the piezoelectric diaphragm is included in a Piezoelectric Micromachined Ultrasonic Transducer (MUT) with a 6 dB velocity bandwidth between 100% and 180%.

* * * * *